(12) United States Patent
Tohoda et al.

(10) Patent No.: US 10,276,733 B2
(45) Date of Patent: Apr. 30, 2019

(54) SOLAR CELL AND SOLAR CELL MODULE

(71) Applicant: Sanyo Electric Co., Ltd., Moriguchi, Osaka (JP)

(72) Inventors: Satoshi Tohoda, Kobe (JP); Hiroyuki Kannou, Izumisano (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 350 days.

(21) Appl. No.: 13/950,418

(22) Filed: Jul. 25, 2013

(65) Prior Publication Data
US 2013/0306129 A1 Nov. 21, 2013

Related U.S. Application Data

(63) Continuation of application No. PCT/JP2012/051160, filed on Jan. 20, 2012.

(30) Foreign Application Priority Data

Jan. 28, 2011 (JP) .................................. 2011-016597

(51) Int. Cl.
*H01L 31/05* (2014.01)
*H01L 31/0224* (2006.01)

(52) U.S. Cl.
CPC .. *H01L 31/022433* (2013.01); *H01L 31/0504* (2013.01); *H01L 31/0508* (2013.01); *Y02E 10/50* (2013.01)

(58) Field of Classification Search
CPC ......... H01L 31/022433; H01L 31/0504; H01L 31/0508
See application file for complete search history.

(56) References Cited

U.S. PATENT DOCUMENTS 5,726,065 A * 3/1998 Szlufcik .......... H01L 31/022425
136/256
6,573,445 B1 * 6/2003 Burgers ...................... 136/256
(Continued)

FOREIGN PATENT DOCUMENTS

JP H9-116175 A 5/1997
JP 2007-214533 A 8/2007
(Continued)

OTHER PUBLICATIONS

Extended European Search Report dated May 19, 2017 for a counterpart European application No. 12738983.1.

*Primary Examiner* — Edward J. Schmiedel
(74) *Attorney, Agent, or Firm* — Metrolexis Law Group, PLLC

(57) ABSTRACT

The solar cell (10) of the present invention comprises: a first electrode (21) including a plurality of finger portions (21*a*), and a busbar portion (21*b*) connected electrically to the plurality of finger portions (21*a*), each of the plurality of finger portions (21*a*) extending along a first direction (y), and the plurality of finger portions (21*a*) being arrayed along a second direction (x) perpendicular to the first direction (y) leaving gaps therebetween; and a plurality of protruding portions (23) provided on at least one side of a first main surface (20A) in the first direction (y) of the busbar portion (21*b*). The plurality of protruding portions (23) are provided so that the total perimeter of the protruding portions (23) per unit area at the ends of the first main surface (20A) in the second direction (x) is longer than the total perimeter of the protruding portions (23) per unit area in the central portion. By means of these characteristics, the solar cell of the present invention is able to effectively suppress delamination of wiring material (11) by suppressing delamination of the ends, which is where delamination of the wiring material (Continued)

begins when the wiring material (11) is connected to the busbar.

23 Claims, 15 Drawing Sheets

(56) References Cited

U.S. PATENT DOCUMENTS

| | | | | |
|---|---|---|---|---|
| 2006/0180198 A1* | 8/2006 | Takamoto | ........... | H01L 31/0687 136/255 |
| 2007/0186968 A1* | 8/2007 | Nakauchi et al. | ............ | 136/244 |
| 2007/0295381 A1* | 12/2007 | Fujii | ............... | H01L 31/022433 136/244 |
| 2008/0149161 A1* | 6/2008 | Nishida | ........... | H01L 31/022433 136/244 |
| 2009/0038675 A1* | 2/2009 | Tsunomura | ......... | H01L 31/0508 136/251 |
| 2009/0194144 A1* | 8/2009 | Taira | .................... | H01L 31/0512 136/244 |
| 2009/0266402 A1* | 10/2009 | Taira | ............... | H01L 31/022433 136/244 |
| 2009/0277491 A1 | 11/2009 | Nakamura et al. | | |
| 2011/0011440 A1* | 1/2011 | Hioki | .............. | H01L 31/022433 136/244 |
| 2012/0125396 A1* | 5/2012 | Taira | ............... | H01L 31/022433 136/244 |
| 2014/0174522 A1* | 6/2014 | Yang | ............... | H01L 31/022433 136/256 |
| 2015/0090334 A1* | 4/2015 | Han | .................... | H01L 31/0201 136/256 |

FOREIGN PATENT DOCUMENTS

| | | |
|---|---|---|
| JP | 2008-135655 A | 6/2008 |
| WO | 2009/122977 A1 | 10/2009 |
| WO | WO-2011013814 A2 * | 2/2011 ..... H01L 31/022433 |

* cited by examiner

SOLAR CELL AND SOLAR CELL MODULE

CROSS-REFERENCE TO RELATED APPLICATIONS

This is a continuation of International Application PCT/JP2012/051160, with an international filing date of Jan. 20, 2012, filed by applicant, the disclosure of which is hereby incorporated by reference in its entirety.

FIELD OF THE INVENTION

The present invention relates to a solar cell and to a solar cell module including this solar cell. The present invention relates more specifically to a solar cell and a solar cell module including this solar cell in which wiring material is bonded using a resin adhesive.

BACKGROUND

Solar cell modules have drawn attention in recent years as an energy source with a low environmental impact. Solar cell modules include a plurality of solar cells connected electrically by wiring material.

The wiring material has been bonded to the solar cells almost exclusively using solder. However, when wiring material and solar cells are bonded using solder, the solar cells are likely to reach a high temperature during the bonding process. As a result, it has recently been proposed, for example, in Patent Document 1, that the wiring material and the solar cells be bonded using a resin adhesive such as an anisotropic conductive resin adhesive.

CITED DOCUMENTS

Patent Documents

Patent Document 1: Laid-Open Patent Publication No. 2007-214533

SUMMARY

Problem Solved by the Invention

When the wiring material and solar cells in a solar cell module are bonded using a resin adhesive, the problem is how to suppress delamination of the wiring material.

In view of this situation, it is an object of the present invention to provide a solar cell module in which the bonding strength of the wiring material has been improved.

Means of Solving the Problem

The solar cell of the present invention includes a first electrode and a second electrode. A photoelectric conversion unit has a first main surface and a second main surface. The first electrode is provided on the first main surface. The second electrode is provided on the second main surface. The first electrode has a plurality of finger portions and a busbar portion. Each of the plurality of finger portions extends in the first direction. The plurality of finger portions are arrayed in a second direction perpendicular to the first direction with space provided between them. The busbar portion is connected electrically to the plurality of finger portions. The solar cell of the present invention also includes a plurality of protruding portions. The plurality of protruding portions are provided on the first main surface on at least one side of the busbar portion in the first direction. The plurality of protruding portions are provided so that the total perimeter of the protruding portions per unit area in an end portion of the first main surface in the second direction is longer than the total perimeter of the protruding portions per unit area in the central portion of the first main surface in the second direction.

The solar cell module of the present invention includes a plurality of solar cells, wiring material, and an adhesive layer of resin. Each solar cell has a photoelectric conversion unit, a first electrode, and a second electrode. The photoelectric conversion unit has first and second main surfaces. The first electrode is provided on the first main surface. The second electrode is provided on the second main surface. The wiring material electrically connects the first electrode and the second electrode in adjacent solar cells. The adhesive layer bonds the solar cell and the wiring material. The first electrode has a plurality of finger portions. Each of the plurality of finger portions extends in the first direction. The plurality of finger portions are arrayed in a second direction perpendicular to the first direction with a space between them. The solar cell also has a plurality of protruding portions. The plurality of protruding portions is provided on the first main surface so that at least some of them overlap with the wiring material. The plurality of protruding portions are provided so that the total perimeter of the protruding portions per unit area in an end portion of the first main surface in the second direction is longer than the total perimeter of the protruding portions per unit area in the central portion of the first main surface in the second direction beneath the wiring material.

Effect of the Invention

The present invention is able to provide a solar cell module in which the bonding strength of the wiring material has been improved.

DETAILED DESCRIPTION

Figure 1:
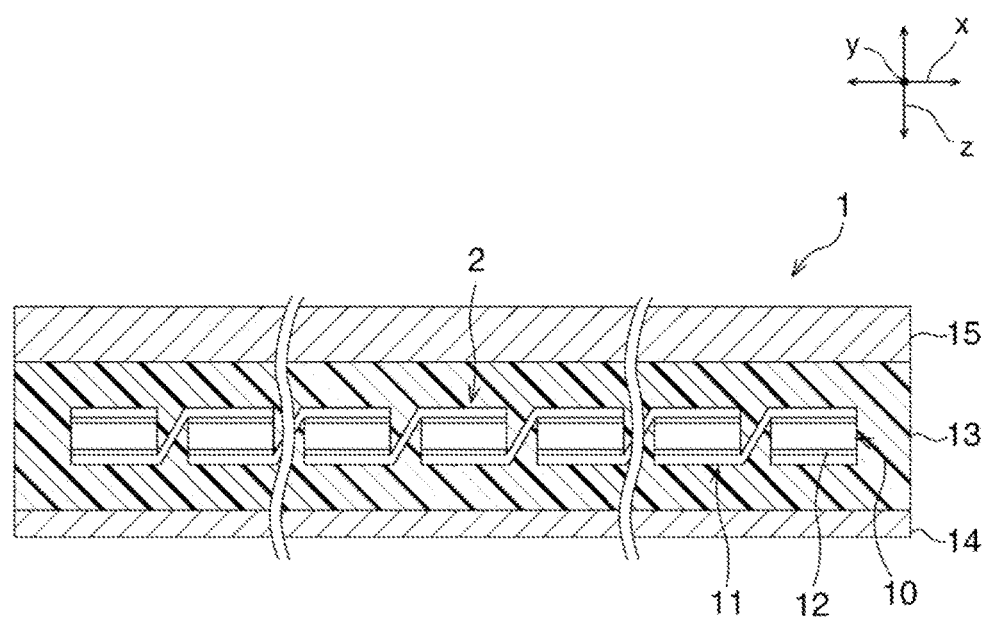
FIG. 1 is a schematic cross-sectional view of a solar cell module according to a first embodiment.

The following is an explanation of preferred embodiments of the present invention. The following embodiments are merely illustrative. The present invention is not limited to these embodiments.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

First Embodiment

Figure 2:
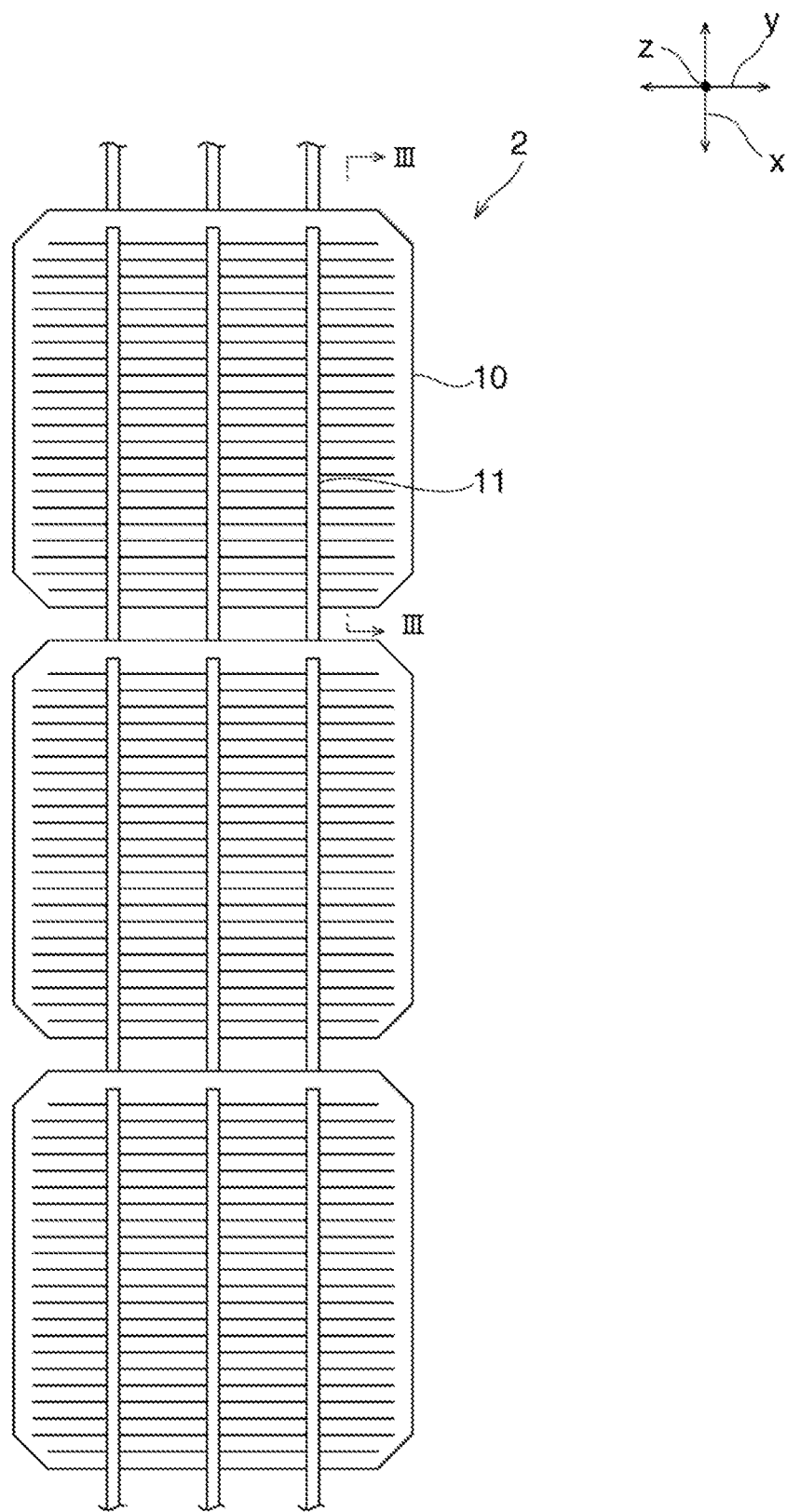
FIG. 2 is a schematic plan view of a solar cell string in the first embodiment.

FIG. 1 is a schematic cross-sectional view of a solar cell module according to a first embodiment. FIG. 2 is a schematic plan view of a solar cell string in the first embodiment. The solar cell module 1 includes a plurality of solar cell strings 2. Each of the plurality of solar cell strings 2 is arranged so that the longitudinal direction of the string is in the x direction. The plurality of solar cell strings 2 are arrayed in the y direction. The plurality of solar cell strings 2 are electrically connected in series or in parallel.

A solar cell string 2 has a plurality of solar cells 10 arrayed in the x direction. The plurality of solar cells 10 are connected electrically by wiring material 11. More specifically, a back surface electrode 22 and a light-receiving surface electrode 21 in solar cells 10 adjacent to each other in the x direction are connected electrically via wiring material 11 to electrically connect the plurality of solar cells 10 in series or in parallel.

In the present embodiment, the solar cells 10 extend in the x direction and are connected electrically via three lines of wiring material 11 arrayed in the y direction. However, the present invention is not limited to this configuration. The number of lines of wiring material used to electrically connect adjacent solar cells can be one, two, four, or more.

The wiring material 11 and solar cells 10 are bonded together using a resin adhesive layer 12. The resin adhesive layer 12 may consist exclusively of a resin. The resin adhesive layer 12 may also comprise a resin layer and anisotropically conductive particles dispersed in the resin layer. Specific examples of conductive particles include metal particles, alloy particles, and insulating particles coated with metal or a metal alloy. When the resin adhesive layer 12 consists exclusively of a resin, the wiring material 11 has to be bonded while in direct contact with the back surface electrode 22 or light-receiving surface electrode 21.

A first protective member 14 is provided on the back surface of the plurality of solar cells 10. A second protective member 15 is provided on the light-receiving surface of the plurality of solar cells 10. Sealing material 13 is provided between the solar cells 10 and the first protective member 14 and between the solar cells 10 and the second protective member 15. The plurality of solar cells 10 are sealed in the sealing material 13.

There are no particular restrictions on the material used as the sealing material 13 or as the first and second protective members 14, 15. The sealing material 13 can be formed using a resin such as an ethylene-vinyl acetate (EVA) copolymer or polyvinyl butyral (PVB).

The first protective member 14 provided on the back surface can be formed of glass, resin film, or resin film with interposed metal foil such as aluminum foil.

The second protective member 15 provided on the light-receiving surface can be a transparent glass or transparent resin plate.

If necessary, the outer periphery of a laminate of the first protective member 14, sealing material 13, solar cells 10, sealing material 13, and second protective member 15 may be surrounded by a metal frame (not shown) such as an Al aluminum frame. If necessary, a terminal box for extracting power from the solar cells 10 may also be formed on the surface of the first protective member 14.

Figure 3:
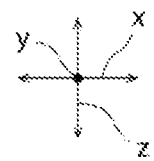
FIG. 3 is a schematic cross-sectional view of a solar cell from line III-III in FIG. 2.
Figure 3:
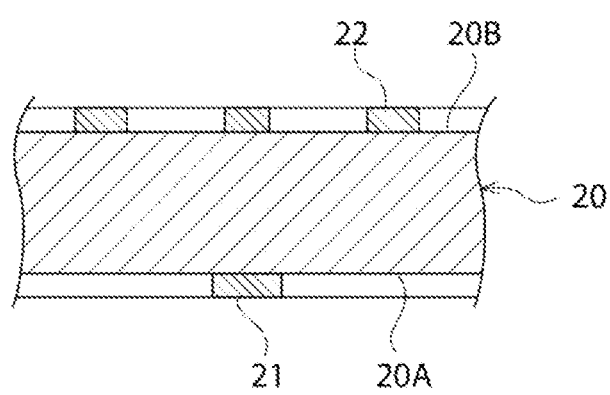
Figure 4:
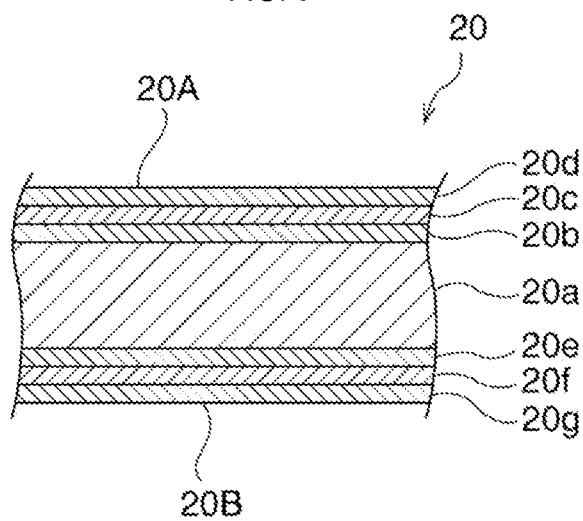
FIG. 4 is a schematic cross-sectional view of the photoelectric conversion unit in the first embodiment.
Figure 5:
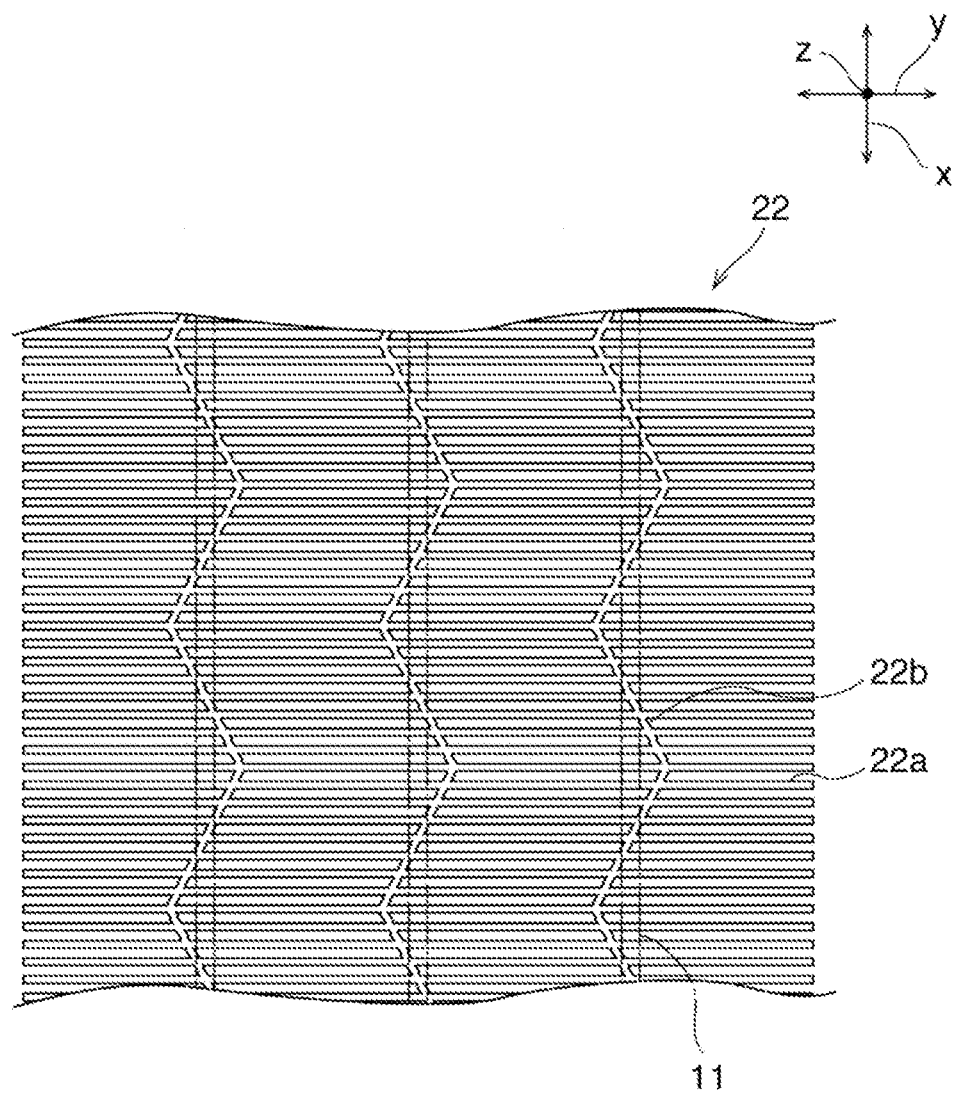
FIG. 5 is a schematic plan view of the back surface electrode in the first embodiment.
Figure 6:
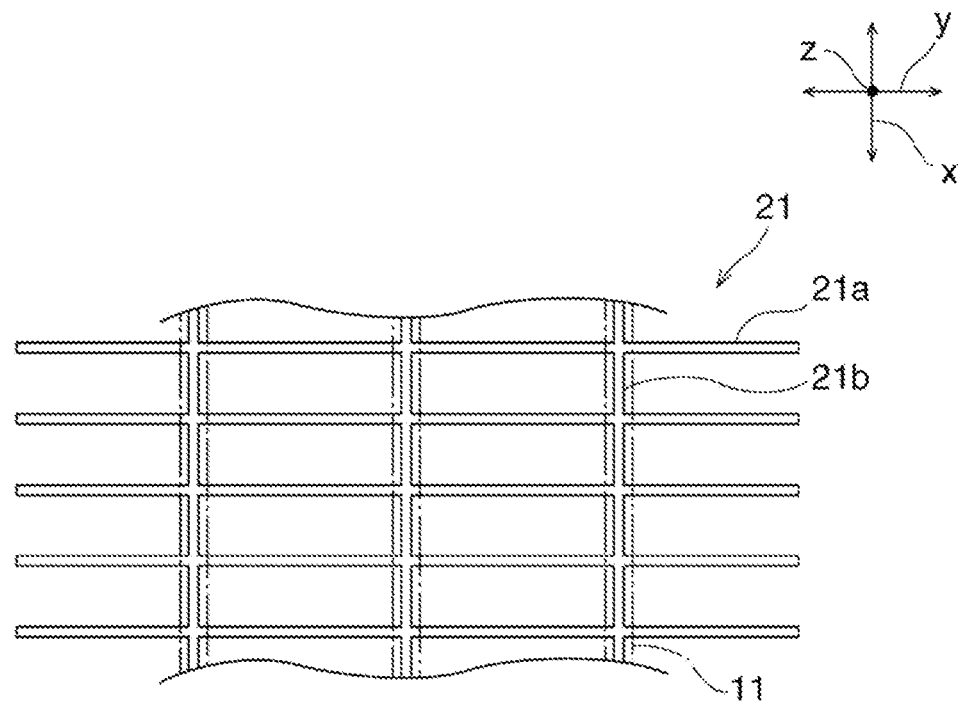
FIG. 6 is a schematic plan view of the light-receiving surface electrode in the first embodiment.

FIG. 3 is a schematic cross-sectional view of a solar cell from line III-III in FIG. 2. FIG. 4 is a schematic cross-sectional view of the photoelectric conversion unit in the first embodiment. FIG. 5 is a schematic plan view of the back surface electrode in the first embodiment. FIG. 6 is a schematic plan view of the light-receiving surface electrode in the first embodiment.

Each solar cell 10 has a photoelectric conversion unit 20. The photoelectric conversion unit 20 generates carriers such as electrons and holes from received light. The photoelectric conversion unit 20 may have, for example, a crystalline semiconductor substrate of one conductive type, a first amorphous semiconductor layer of the other conductive type arranged on one of the main surfaces of the substrate, and a second amorphous semiconductor layer of the one conductive type on the other main surface of the substrate. Here, an i-type amorphous semiconductor layer of a thickness that does not substantially contribute to the generation of electricity may be provided between the crystalline semiconductor substrate and at least one of the first and second amorphous semiconductor layers. The photoelectric conversion unit 20 may also have a semiconductor substrate having an n-type dopant diffusion region and p-type dopant diffusion region exposed on the surface.

In the present embodiment, the photoelectric conversion unit 20 has an n-type crystalline semiconductor substrate 20a. This n-type crystalline semiconductor substrate 20a can be made of n-type crystalline silicon. Here, "crystalline" includes both single-crystal and polycrystalline.

Both main surfaces of the semiconductor substrate 20a have a textured structure. Here, "textured structure" means an uneven structure formed to inhibit surface reflection and increase the amount of light absorbed by the photoelectric conversion unit. A specific example of a textured structure is a pyramidal uneven structure (pyramid or truncated pyramid) obtained by performing anisotropic etching on the surface of a single-crystal silicon substrate having a (100) plane.

An n-type amorphous semiconductor layer 20c is provided on top of the light-receiving surface of the semiconductor substrate 20a. The n-type amorphous semiconductor layer 20c can be made of an n-type amorphous silicon layer containing hydrogen. An i-type amorphous semiconductor layer 20b of a thickness almost not to contribute the generation of electricity is arranged between the n-type amorphous semiconductor layer 20c and the semiconductor substrate 20a. This i-type amorphous semiconductor layer 20b can be made of an i-type amorphous silicon layer containing hydrogen. A transparent conductive layer 20d is arranged on top of the n-type amorphous semiconductor layer 20c. The surface of the transparent conductive layer 20d constitutes the light-receiving surface 20A of the photoelectric conversion unit 20.

A p-type amorphous semiconductor layer 20f is provided on the main surface of the semiconductor substrate 20a on the back surface side. The p-type amorphous semiconductor layer 20f can be made of an n-type amorphous layer containing hydrogen. An i-type amorphous semiconductor layer 20e of a thickness almost not to contribute the generation of electricity is arranged between the p-type amorphous semiconductor layer 20f and the semiconductor substrate 20a. This i-type amorphous semiconductor layer 20e can be made of an i-type amorphous silicon layer containing hydrogen. A transparent conductive layer 20g is arranged on top of the p-type amorphous semiconductor layer 20f. The surface of the transparent conductive layer 20g constitutes the back surface 20B of the photoelectric conversion unit 20. The transparent conductive layer 20g and the transparent conductive layer 20d can be a film of a transparent conductive oxide such as indium tin oxide (ITO) or ZnO. In this configuration, an n-type amorphous semiconductor layer 20c is provided on top of the semiconductor substrate 20a on the light-receiving surface side, and a p-type amorphous semiconductor layer 20f is provided on top of the main surface on the back surface side. However, the p-type amorphous semiconductor layer 20f may be provided on top of the main surface on the light-receiving surface side, and the n-type amorphous semiconductor layer 20c may be provided on top of the main surface on the back surface side.

The light-receiving surface electrode 21 is provided on top of the light-receiving surface 20A of the photoelectric conversion unit 20. In the present embodiment, the light-receiving surface electrode 21 is an n-side electrode for collecting electrons as the majority carrier. The back surface electrode 22 is provided on top of the back surface 20B of the photoelectric conversion unit 20. In the present embodiment, the back surface electrode 22 is a p-side electrode for collecting holes as the minority carrier.

The light-receiving surface electrode 21 and the back surface electrode 22 can be made of any suitable conductive material. For example, the light-receiving surface electrode 21 and the back surface electrode 22 can be made of a metal such as silver, aluminum, copper or tin, an alloy containing at least one of these metals, or a transparent conductive oxide. The light-receiving surface electrode 21 and the back surface electrode 22 can be formed using a conductive paste or formed by plating.

The back surface electrode 22 has a plurality of finger portions 22a and at least one busbar portion 22b. Each of the plurality of finger portions 22a is linear in the y direction. The plurality of finger portions 22a are arrayed in the x direction with space provided between them. The plurality of finger portions 22a are connected electrically by at least one busbar portion 22b. In the present embodiment, there are three busbar portions 22b corresponding to the number of lines of wiring material 11. The wiring material is provided so as to overlap at least some of the busbar portions 22b.

In the present embodiment, each of the busbar portions 22b is zigzag shaped and extends in the x direction. However, the busbar portions 22b may be linear. The back surface electrode may be a so-called busbarless electrode having only a plurality of finger portions without a busbar portion. The back surface electrode may also be a planar electrode provided over the entire back surface 20B of the photoelectric conversion unit 20.

The width of the finger portions 22a is preferably from 0.05 mm to 0.2 mm. The pitch (center-to-center distance) of the finger portions 22a in the x direction is preferably from 0.4 mm to 1.0 mm. The width of the busbar portions 22b is preferably from 0.05 mm to 0.3 mm.

The light-receiving surface electrode 21 has a plurality of finger portions 21a and at least one busbar portion 21b. Each of the plurality of finger portions 21a is linear in the y direction. The plurality of finger portions 21a are arrayed in the x direction at equal intervals with space provided between them. There are fewer finger portions 21a on the light-receiving side than there are finger portions 22a on the back surface side in order to reduce shadow loss. The finger portions 21a on the light-receiving side are thicker than the finger portions 22a on the back surface side in order to reduce resistance loss. For example, the thickness of the finger portions 21a on the light-receiving side is 1.5 times greater than the thickness of the finger portions 22a on the back surface side.

The plurality of finger portions 21a are connected electrically by at least one busbar portion 21b. In the present embodiment, as in the case of the busbar portions 22b of the back surface electrode 22, there are three busbar portions 21b corresponding to the number of lines of wiring material 11. However, there is no particular restrictions on the number of busbar portions in the present invention. The number of busbar portions can be one, two, four, or more.

Each of the three busbar portions 21b is linear and extends in the x direction. The wiring material 11 is provided so as to overlap with at least some of the busbar portions 21b. More specifically, in the present embodiment, the wiring material 11 is provided so as to overlap with the all of the busbar portions 21b in their entirety.

The width of the busbar portions 21a is preferably from 0.05 mm to 0.2 mm. The width of the finger portions 21a is preferably from 0.5 to 2 times the width of the finger portions 22a. The pitch (center-to-center distance) of the finger portions 21a in the x direction is preferably from 1 mm to 4 mm. The pitch of the finger portions 21a in the x direction is preferably from 1 to 6 times the pitch of the finger portions 22a in the x direction. The width of the busbar portions 21b is preferably from 0.05 mm to 2 mm. The width of the busbar portions 21b is preferably 0.5 to 2 times the width of the busbar portions 22b.

Figure 7:
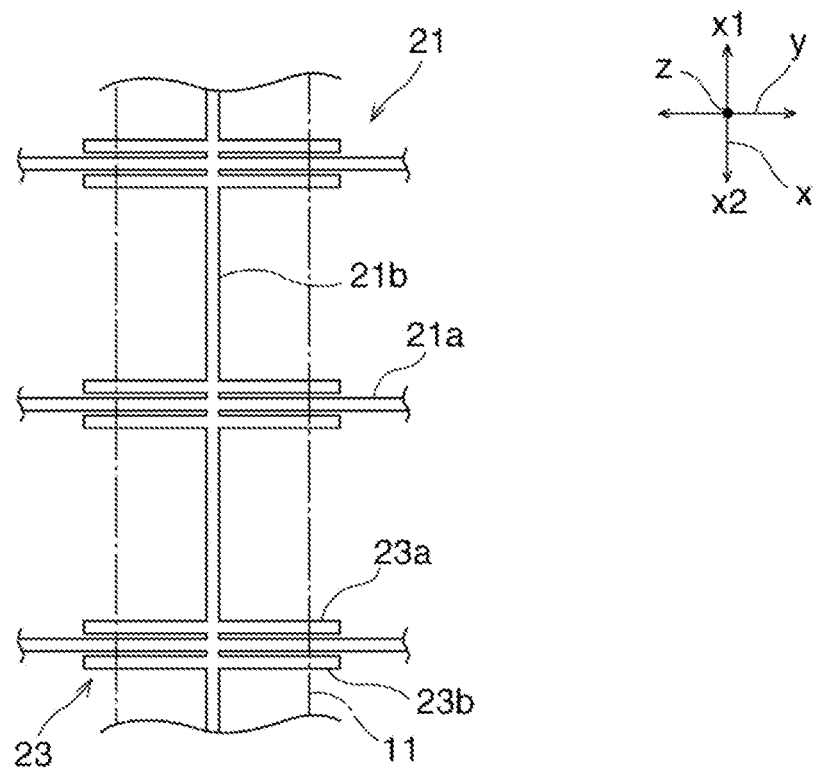
FIG. 7 is a schematic plan view of a portion of the light-receiving surface electrode in the first embodiment in the central portion of the light-receiving surface in the x direction.
Figure 8:
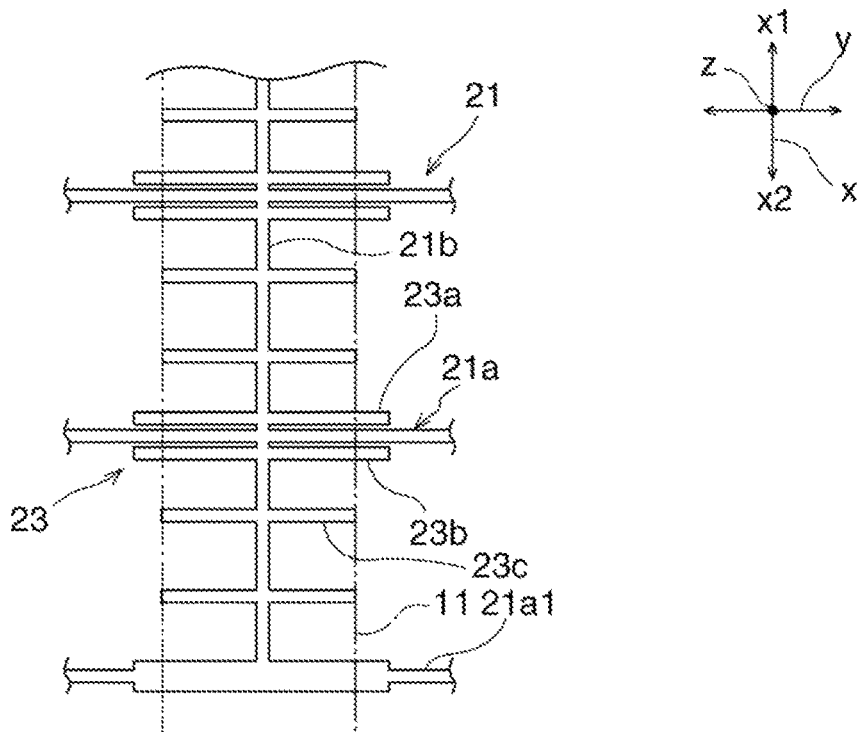
FIG. 8 is a schematic plan view of a portion of the light-receiving surface electrode in the first embodiment in an end portion of the light-receiving surface in the x direction.

FIG. 7 is a schematic plan view of a portion of the light-receiving surface electrode 21 in the first embodiment in the central portion of the light-receiving surface 20A in the x direction. FIG. 8 is a schematic plan view of a portion of the light-receiving surface electrode 21 in the first embodiment in an end portion of the light-receiving surface 20A in the x direction. Each solar cell 10 has protruding portions 23 provided on the light-receiving surface 20A. The protruding portions 23 have a shape which protrudes from the light-receiving surface 20A in the thickness direction of the photoelectric conversion unit 20.

In the present embodiment, the protruding portions 23 are conductive members. More specifically, the protruding portions 23 are made of the same material as the light-receiving surface electrode 21. The height of the protruding portions 23 in the z direction is equal to the height of the finger portions 21a in the z direction. Here, "equal in height" means the height of each member is in a range extending from 0.5 to 1.5 times the mean height.

The protruding portions 23 include protruding portions 23a and 23b, and protruding portion 23c. Protruding portions 23a and 23b are linear and extend in the y direction. Thus, protruding portions 23a and 23b are parallel to the finger portions 21a.

The protruding portions 23a, 23b are provided on the light-receiving surface 20A on at least one side of the busbar portion 21b in the y direction. More specifically, the protruding portions 23a, 23b are provided so as to span the busbar portion 21b from one side to the other in the y direction. The protruding portions 23a, 23b are connected to at least one of a busbar portion 21b and a finger portion 21a. More specifically, the protruding portions 23a, 23b are connected to the busbar portion 21b. The protruding portions 23a, 23b intersect the busbar portion 21b. The angle formed by the protruding portions 23a, 23b and the busbar portion 21b is substantially perpendicular.

At least some of the protruding portions 23a, 23b overlaps with the wiring material 11. In the present embodiment, more specifically, the length of the protruding portions 23a, 23b is greater than the width of the busbar portion 21b. Some of the protruding portions 23a, 23b overlap with the wiring material 11, and both ends extend beyond the wiring material 11 to the outside in the y direction.

Protruding portion 23a is arranged on the x1 side of the finger portion 21a in the x direction. Protruding portion 23b is arranged on the x2 side of the finger portion 21a in the x direction. The protruding portions 23a, 23b are arranged symmetrically, interposing the same finger portion 21a. The protruding portions 23a, 23b are provided near the finger portion 21a in the x direction. The distance between the protruding portions 23a, 23b arranged between adjacent finger portions 21a, 21a is greater than the distance between the finger portion 21a and protruding portion 23a, and is greater than the distance between the finger portion 21a and protruding portion 23a. More specifically, the protruding portions 23a, 23b are arranged so that the distance between the protruding portions 23a, 23b and the finger portion 21a is one-tenth the pitch of the finger portion 21a in the x direction or less. The protruding portions 23a, 23b are also arranged so that the distance between the protruding portions 23a, 23b and the finger portion 21a in the x direction is 0.25 mm or less. The protruding portions 23a, 23b are also arranged so that the distance between the protruding portions 23a, 23b and the finger portion 21a in the x direction is four times the width of the finger portion 21a or less.

The width of the protruding portions 23a, 23b in the x direction is within a range from 0.5 to 3 times the width of the finger portion 21a. The width of the protruding portions 23a, 23b in the x direction is preferably within a range from 1 to 1.5 times the width of the finger portion 21a.

In the present embodiment, the section of the plurality of finger portions 21a in which finger portion 21a1 overlaps the wiring material 11 at the outside edge of the wiring material 11 is thicker than the other finger portions 21a. In this way, delamination of the wiring material 11 can be suppressed in the end portion.

A plurality of protruding portions 23c are arranged between adjacent finger portions 21a in the x direction in the end portions in the x direction. The plurality of protruding portions 23c are not provided near the finger portions 21a. Protruding portions 23c are provided in at least one end portion of the light-receiving surface 20A in the x direction. In the present embodiment, the protruding portions 23c are provided in a region in which the end portion of the wiring material 11 is located on the light-receiving surface 20A. The protruding portions 23c are not provided in the central portion of the light-receiving surface 20A in the x direction.

Protruding portion 23c is linear and extends in the y direction. Therefore, protruding portion 23c is parallel to the finger portion 21a. Also, the protruding portion 23c is parallel to protruding portion 23a and protruding portion 23b. The length of the protruding portion 23c in the y direction is shorter than the lengths of the protruding portions 23a, 23b in the y direction. More specifically, the protruding portion 23c is provided so as to overlap with the wiring material 11 in its entirety. More specifically, the length of the protruding portion 23c in the y direction is substantially the same as the width of the wiring material 11.

The protruding portion 23c is not provided near the finger portion 21a in the x direction. The protruding portion 23c is provided between protruding portion 23a and protruding portion 23b. A plurality of protruding portions 23c is arranged at substantially equal intervals between adjacent finger portions 21a in the x direction. As a result, the interval between the protruding portion 23c and an adjacent protruding portion 23c or between the protruding portion 23c and the protruding portions 23a, 23b is wider than the interval between the protruding portions 23a, 23b and the finger portion 21a in the x direction.

The protruding portion 23a is connected to at least one of a busbar portion 21b and a finger portion 21a. More specifically, the protruding portion 23a is connected to a busbar portion 21b. Even more specifically, the protruding portion 23a intersects the busbar portion 21b.

In the present invention, a protruding portion 23c is provided, and the total perimeter of the protruding portions 23 per unit area in an end portion of the light-receiving surface 20A in the x direction is longer than the total perimeter of the protruding portions 23 per unit area in the central portion of the light-receiving surface 20A in the x direction beneath the wiring material 11. More specifically, the total perimeter of the protruding portions 23 per unit area in an end portion of the light-receiving surface 20A in the x direction is at least 1.1 times greater than the total perimeter of the protruding portions 23 per unit area in the central portion of the light-receiving surface 20A in the x direction beneath the wiring material 11.

Also, among the plurality of protruding portions 23, the number of protruding portions 23 per unit area in an end portion of the light-receiving surface 20A in the x direction is greater than the number of protruding portions 23 per unit area in the central portion of the light-receiving surface 20A beneath the wiring material 11. More specifically, the number of protruding portions 23 per unit area in an end portion of the light-receiving surface 20A in the x direction is at least 1.1 times greater than the number of protruding portions 23 per unit area in the central portion of the light-receiving surface 20A beneath the wiring material 11.

The width of the protruding portions 23c in the x direction is within the range of 0.5 to 3 times the width of the finger portions 21a.

Figure 9:
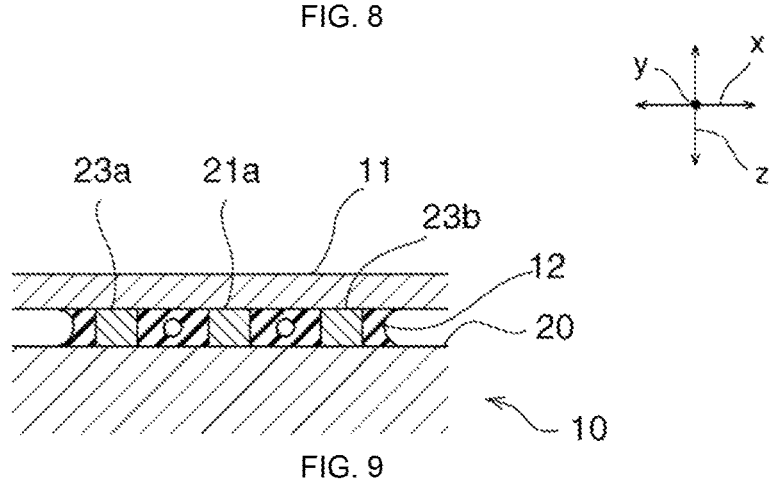
FIG. 9 is a schematic cross-sectional view of an enlarged portion of the solar cell module in the first embodiment.

In the present embodiment, as explained above, the protruding portions 23a, 23b are provided near the finger portion 21a in the x direction. Therefore, as shown schematically in FIG. 9, the bonding strength between the wiring material 11 and the solar cell 10 is greater near the finger portion 21a. More specifically, the side surface of the finger portion 21a and the surface of the wiring material 11 are bonded via a resin adhesive layer 12, and the side surface of the protruding portions 23a, 23b and the surface of the wiring material 11 are bonded via a resin adhesive layer 12. Therefore, the area in which the solar cell 10 and the wiring material 11 are bonded via the adhesive layer 12 is increased near the finger portion 21a. As a result, the bonding strength between the wiring material 11 and the solar cell 10 is increased near the finger portion 21a. Therefore, delamination of the wiring material 11 can be suppressed, and the electrical connection between the finger portion 21a and the wiring material 11 can be reliably ensured.

Figure 10:
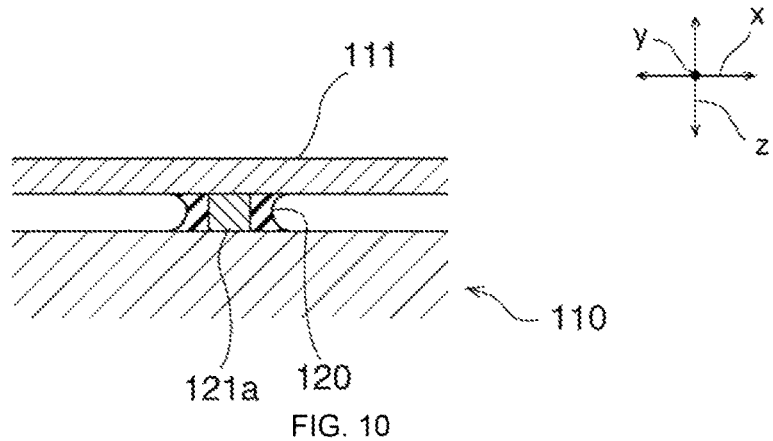
FIG. 10 is a schematic cross-sectional view of an enlarged portion of the solar cell module in a comparative example.

When protruding portions 23a, 23b are not provided near the finger portion 121a, the region in which the side surface of the finger portion 121a and the wiring material 111 are bonded via the adhesive layer 120 is reduced as shown in FIG. 10. Therefore, the area in which the solar cell 110 and the wiring material 111 are bonded via the adhesive layer 120 is reduced in size near the finger portion 121a. Therefore, the bonding strength of the wiring material 111 cannot be sufficiently increased.

In the present embodiment, protruding portions 23a, 23b are provided on both sides of the finger portion 21a in the x direction. Compared to a situation in which protruding portions are provided on only one side of the finger portion 21a, the bonding strength between the wiring material 11 and the solar cell 10 can be further increased. The electrical connection between the finger portion 21a and the wiring material 11 can also be reliably maintained.

Preferably, a portion of the resin adhesive layer 12 spanning a side wall of the protruding portions 23a, 23b and the wiring material 11 is continuous with a portion of the resin adhesive layer 12 spanning a side wall of the finger portion 21a and the wiring material 11. This can further increase the bonding strength of the solar cell 10 and the wiring material 11 near the finger portion 21a. This can also more reliably ensure an electrical connection between the finger portion 21a and the wiring material 11.

From the standpoint of a further strengthening the bonding strength between the wiring material 11 and the solar cell 10, the protruding portions 23a, 23b are provided as shown in the present embodiment so that the distance between the protruding portions 23a, 23b and the finger portion 21a in the x direction is preferably less than one-third, and more preferably less than one-tenth, the pitch of the finger portions 21a in the x direction. The protruding portions 23a, 23b are provided so that the distance between the protruding portions 23a, 23b and the finger portions 21a in the x direction is preferably less than 0.7 mm, and more preferably less than 0.25 mm. The protruding portions 23a, 23b are provided so that the distance between the protruding portions 23a, 23b and the finger portion in the x direction is preferably less than 10 times the width, and more preferably less than 4 times the width, of the finger portion 21a.

In the present embodiment, the protruding portions 23a, 23b are inclined with respect to the x direction, which is the direction that the wiring material 11 is extended. More specifically, they are linear and extend in the perpendicular y direction. The region in which the side surfaces of the protruding portions 23a, 23b and the wiring material 11 are bonded via the resin adhesive layer 12 extends in the y direction, which is perpendicular to the direction in which the wiring material 11 is extended. In other words, the bonding strength of the wiring material 11 to the solar cell 10 is effectively increased in the x direction in the vicinity of the region in which the protruding portions 23a, 23b have been provided. Therefore, the wiring material 11 is less likely to delaminate from the solar cell 10 when the solar cell 10 is arranged in the x direction compared to a situation in which the protruding portions are parallel to the direction in which the wiring material extends.

However, from the standpoint of increasing the bonding strength of the wiring material 11 and the solar cell 10, the protruding portions 23a, 23b are preferably provided over the entire area in which the wiring material 11 is provided in the y direction. The protruding portions 23a, 23b to not have to extend to the outside of the wiring material 11. From the standpoint of suppressing a reduction in the light-receiving efficiency of the light-receiving surface 20A while also reducing the cost of forming the protruding portions, the protruding portions are preferably provided from one end of the wiring material to the other in the y direction, but not to the outside of the wiring material. However, in this situation, a protruding portion may not be formed under the wiring material in a section if there is a misalignment between the wiring material and the solar cell. As a result, there is a possibility that the bonding strength of the wiring material and solar cell will not be sufficiently increased.

In the present embodiment, by contrast, the protruding portions 23a, 23b extend to the outside of the wiring material 11 in the y direction, which is the width direction of the wiring material 11. As a result, a situation can be prevented in which protruding portions 23a, 23b are not formed under the wiring material 11 in a section due to a misalignment in the y direction of the wiring material 11. Therefore, the bonding strength of the wiring material 11 and the solar cell 10 can be increased even when a misalignment has occurred in the y direction of the wiring material 11. In other words, the bonding strength of the wiring material 11 and the solar cell 10 can be reliably increased. From the standpoint of reliably increasing the bonding strength between the wiring material 11 and the solar cell 10, the length of the protruding portions 23a, 23b in the y direction is preferably at least 0.1 times longer, and more preferably at least 0.3 times longer, than the width of the wiring material 11. The width of the protruding portions 23a, 23b in the y direction is preferably at least 1.1 times greater, and more preferably at least 1.3 times greater, than the width of the wiring material 11.

Also, because the height of the protruding portions 23 is equal to the height of the finger portion 21a, the bonding strength of the wiring material 11 and the solar cell 10 can be even more effectively increased.

Also, the width of the protruding portions 23a, 23b in the x direction is from 0.5 times to 3 times the width of the finger portion 21a. As a result, the finished width and height of the protruding portions 23a, 23b are finished close to the finger portion 21a. However, in order to improve the finishing precision, the width of the protruding portions 23 in the x direction is preferably from 1 to 1.5 times the width of the finger portion 21a.

In the present embodiment, the protruding portions 23 are connected to at least one of the busbar portion 21b and finger portion 21a, and the protruding portions 23 are conductive members. As a result, the protruding portions 23 function to reduce the contact resistance with the wiring material. This increases the photoelectric conversion efficiency.

In the present embodiment, the protruding portions 23 intersect the busbar portion 21b. As a result, the adhesive originally on the busbar portion 21b and the protruding portions 23 flows outward near the intersection between the busbar portion 21b and the protruding portions 23 when the wiring material 11 is connected to the solar cell 10 to increase the amount of adhesive. This improves the contact strength between the wiring material 11 and the busbar portion 21b.

In the present invention, the protruding portion 23 is made of the same material as the light-receiving side electrode 21. As a result, the protruding portions 23 can be formed at the same time as the light-receiving surface electrode 21 is formed. This simplifies the manufacturing process for the solar cell 10.

Also, in the present embodiment, a protruding portion 23c is provided in addition to the protruding portions 23a, 23b arranged near the finger portion 21a. This increases the bonding strength of the wiring material 11 and the solar cell 10 not only near the finger portion 21a but also in the region between finger portions 21a. As a result, delamination of the wiring material 11 is even more effectively suppressed.

More specifically, in the present embodiment, this protruding portion 23c, as shown in FIG. 7 and FIG. 8, is provided in at least one end portion of the light-receiving surface 20A of the photoelectric conversion unit 20 in the x direction. In this way, the total perimeter of the protruding portions 23 per unit area in an end portion of the light-receiving surface 20A in the x direction is longer than the total perimeter of the protruding portions 23 per unit area in the central portion of the light-receiving surface 20A in the x direction beneath the wiring material 11. This effectively increases the bonding strength of the wiring material 11 to the solar cell 10 in the end portion. This also more effectively suppresses delamination of the wiring material 11.

From the standpoint of more effectively suppressing delamination of the wiring material 11, the total perimeter of the protruding portions 23 per unit area in an end portion of the light-receiving surface 20A in the x direction preferably is 1.1 times greater, and more effectively 1.5 times greater, than the total perimeter of the protruding portions 23 per unit area in the central portion of the light-receiving surface 20A in the x direction beneath the wiring material 11. Also, the number of protruding portions 23 per unit area in an end portion of the light-receiving surface 20A in the x direction is greater than the number of protruding portions 23 per unit area in the central portion of the light-receiving surface 20A in the x direction beneath the wiring material 11. The number of protruding portions 23 per unit area in an end portion of the light-receiving surface 20A in the x direction is preferably 1.1 times greater, and more preferably 1.5 times greater, than the number of protruding portions 23 per unit area in the central portion of the light-receiving surface 20A in the x direction beneath the wiring material 11.

A protruding portion 23c may be provided in the central portion of the light-receiving surface 20A in the x direction. However, in this case, the number of protruding portions 23c is increased, which also increases the costs associated with forming protruding portions 23c. Therefore, from the standpoint of reducing manufacturing costs associated with solar cells 10, a protruding portion 23c is preferably not provided in the central portion of the light-receiving surface 20A in the x direction.

In the present embodiment, the width of the protruding portion 23c in the x direction is 0.5 to 3 times the width of the finger portion 21a. In this case, the finishing width and height of the protruding portions 23a, 23b is finished near the finger portion 21a.

In the explanation of the present embodiment, the protruding portions were provided on the light-receiving surface. Protruding portions were not provided on the back surface. Because more finger portions can be provided on the back surface, the bonding strength of the wiring material is greater on the back surface than on the light-receiving surface, which has fewer finger portions. However, the present invention is not limited to this configuration. For example, protruding portions may be provided on the back surface and not on the light-receiving surface. Protruding portions may also be provided on both the light-receiving surface and the back surface.

The following is an explanation of other preferred embodiments of the present invention. In the following explanation, components with functions substantially identical to those in the first embodiment have been denoted by the same number, and further explanation of these components has been omitted.

2nd-4th Embodiments

Figure 11:
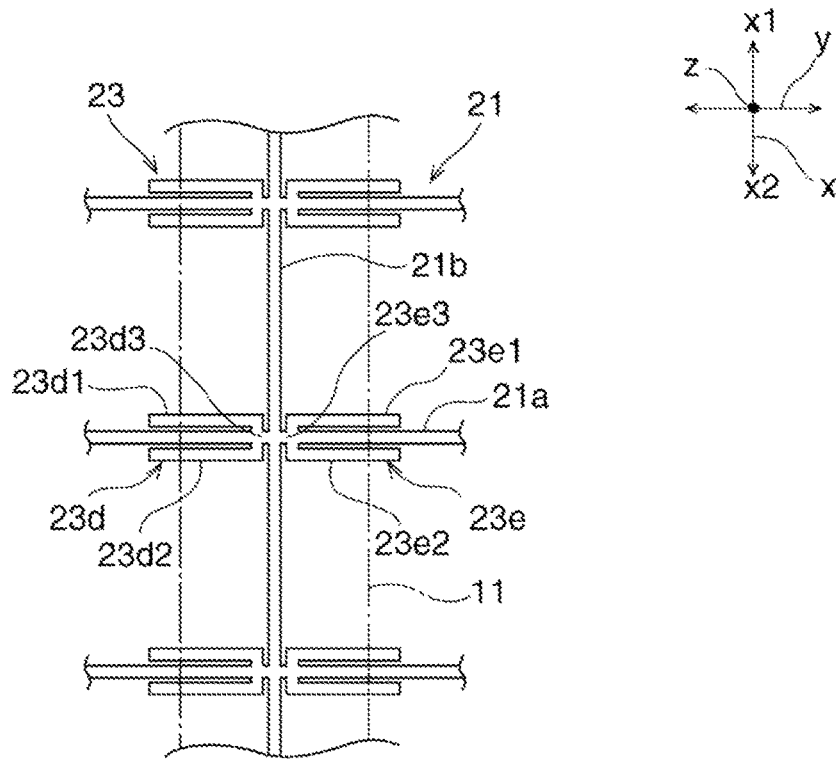
FIG. 11 is a schematic plan view of a portion of the light-receiving surface electrode in the second embodiment in the central portion of the light-receiving surface in the x direction.
Figure 12:
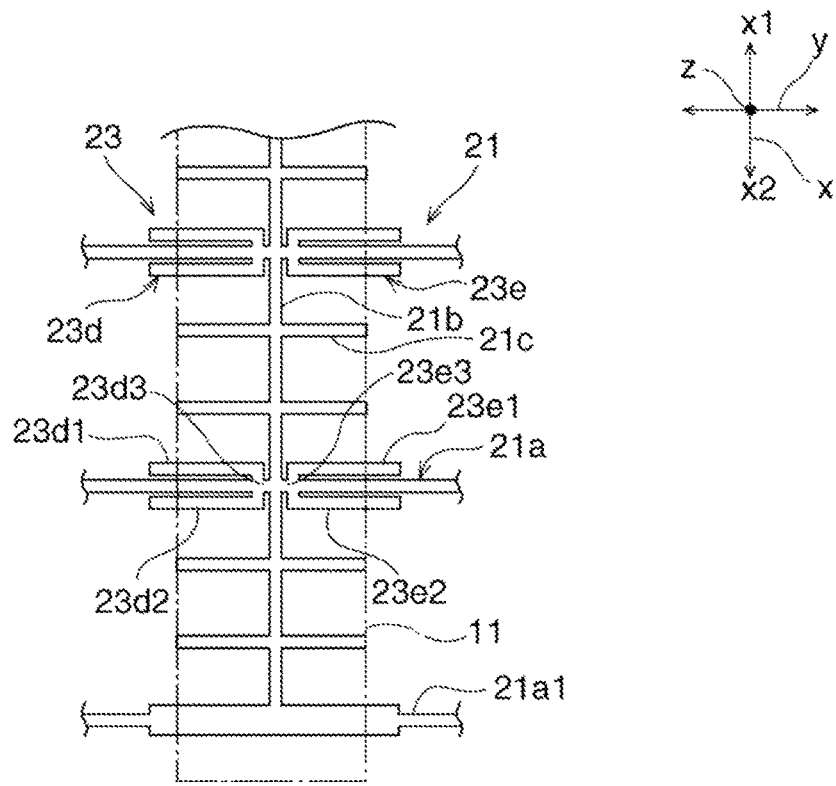
FIG. 12 is a schematic plan view of a portion of the light-receiving surface electrode in the second embodiment in an end portion of the light-receiving surface in the x direction.
Figure 13:
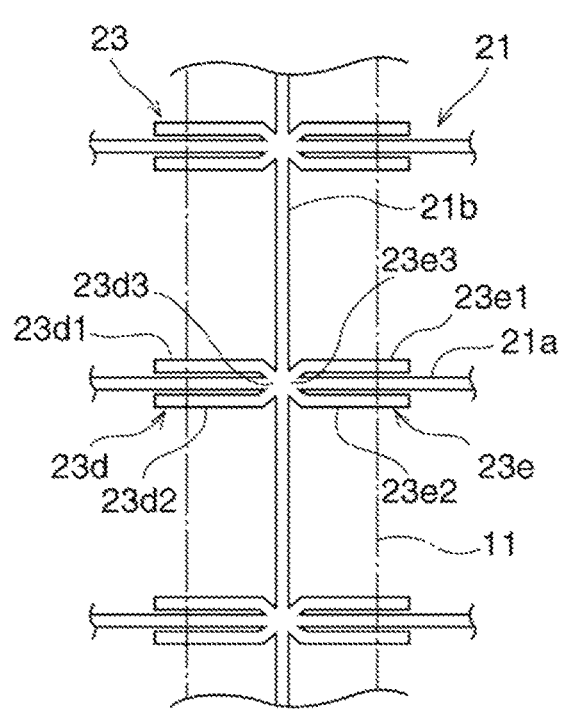
FIG. 13 is a schematic plan view of a portion of the light-receiving surface electrode in the third embodiment in the central portion of the light-receiving surface in the x direction.
Figure 14:
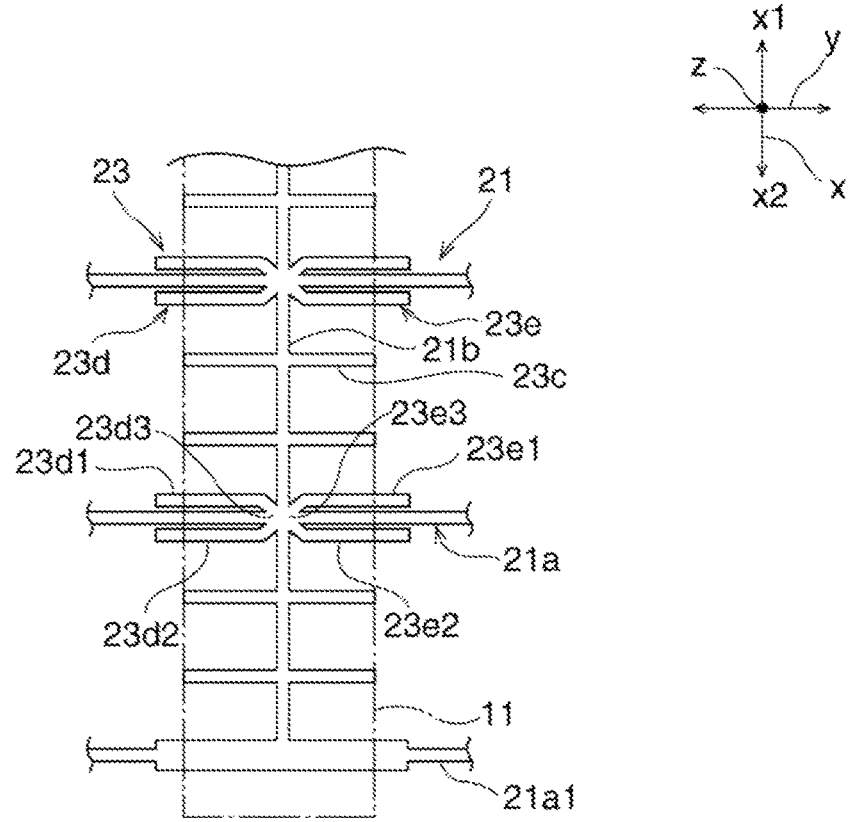
FIG. 14 is a schematic plan view of a portion of the light-receiving surface electrode in the third embodiment in an end portion of the light-receiving surface in the x direction.
Figure 15:
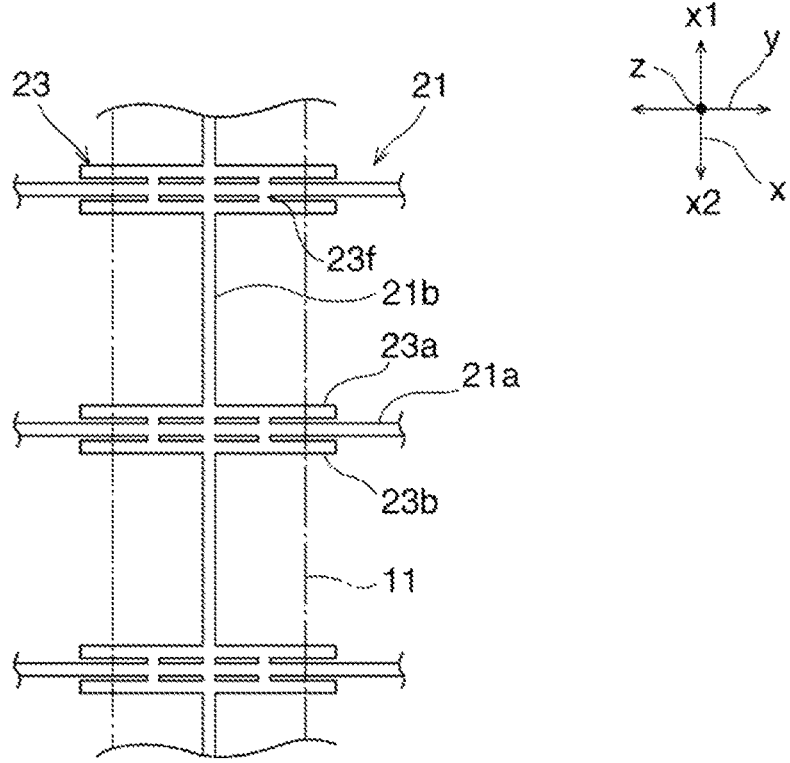
FIG. 15 is a schematic plan view of a portion of the light-receiving surface electrode in the fourth embodiment in the central portion of the light-receiving surface in the x direction.
Figure 16:
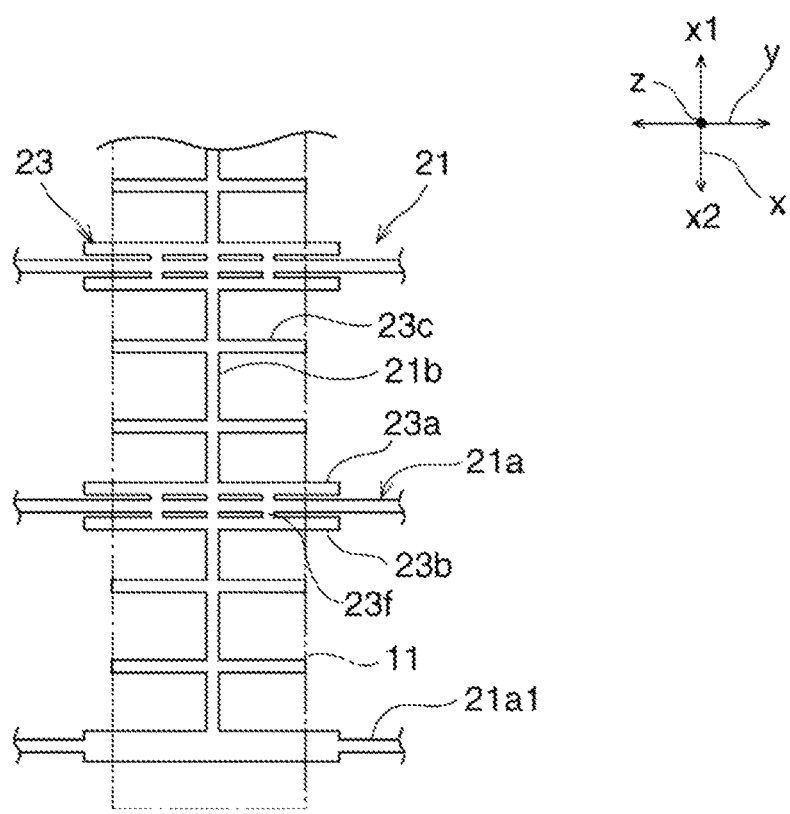
FIG. 16 is a schematic plan view of a portion of the light-receiving surface electrode in the fourth embodiment in an end portion of the light-receiving surface in the x direction.

FIG. 11 is a schematic plan view of a portion of the light-receiving surface electrode 21 in the second embodiment in the central portion of the light-receiving surface 20A in the x direction. FIG. 12 is a schematic plan view of a portion of the light-receiving surface electrode 21 in the second embodiment in an end portion of the light-receiving surface 20A in the x direction. FIG. 13 is a schematic plan view of a portion of the light-receiving surface electrode 21 in the third embodiment in the central portion of the light-receiving surface 20A in the x direction. FIG. 14 is a schematic plan view of a portion of the light-receiving surface electrode 21 in the third embodiment in an end portion of the light-receiving surface 20A in the x direction. FIG. 15 is a schematic plan view of a portion of the light-receiving surface electrode 21 in the fourth embodiment in the central portion of the light-receiving surface 20A in the x direction. FIG. 16 is a schematic plan view of a portion of the light-receiving surface electrode 21 in the fourth embodiment in an end portion of the light-receiving surface 20A in the x direction.

The second through fourth embodiments have the same configuration as the first embodiment except for the shape of the protruding portions 23 provided near the finger portion 21a.

In the second embodiment, protruding portions 23d, 23e are provided instead of protruding portions 23a, 23b. These protruding portions 23d, 23e are U-shaped. More specifically, protruding portions 23d, 23e are U-shaped with the opening facing away from the busbar portion 21b. In other words, protruding portion 23d comprises a pair of linear portions 23d1, 23d2 extending in the y direction and arrayed in the x direction with space provided between them, and a linear portion 23d3 connecting the end portions of linear portions 23d1, 23d2 to the busbar portion 21b. Protruding portion 23e comprises a pair of linear portions 23e1, 23e2 extending in the y direction and arrayed in the x direction with space provided between them, and a linear portion 23e3 connecting the end portions of linear portions 23e1, 23e2 to the busbar portion 21b.

The protruding portions 23d, 23e do not connect to the busbar portion 21b, but make contact with the finger portion 21a. The protruding portions 23d, 23e intersect the finger portion 21a.

The third embodiment differs from the second embodiment only in that the linear portions 23d3, 23e3 are substantially V-shaped and project towards the busbar portion 21b. In the third embodiment, the linear portions 23d3, 23e3 pass through the region in which the busbar portion 21b and the finger portion 21a intersect.

In the fourth embodiment, a linear portion 23f extends in the x direction to connect the protruding portions 23a, 23b on both sides of the busbar portion 21b.

In the second through the fourth embodiments, as in the case of the first embodiment, protruding portions 23 are provided near the finger portion 21a to be able to suppress delamination of the wiring material 11. This reliably maintains the connection between the wiring material 11 and the light-receiving surface electrode 21.

In the second through the fourth embodiments, as in the case of the first embodiment, the total perimeter of the protruding portions 23 per unit area in an end portion of the light-receiving surface 20A in the x direction is longer than the total perimeter of the protruding portions 23 per unit area in the central portion of the light-receiving surface 20A in the x direction beneath the wiring material 11. This also more effectively suppresses delamination of the wiring material 11. Because protruding portions 23c are not provided in the central portion of the light-receiving surface 20A in the x direction, manufacturing costs associated with the solar battery 10 can be reduced.

In the second embodiment, linear portions 23d, 23e are provided which extend in the x direction. In the fourth embodiment, linear portion 23f is provided which extends in the x direction.

In the second through fourth embodiments, the protruding portions 23d, 23e, 23f intersect the finger portion 21a. Because this increases the area of the wiring material 11 making contact with the protruding portions 23d, 23e, 23f and the finger portion 21a, the contact resistance can be reduced.

5th-7th Embodiments

Figure 17:
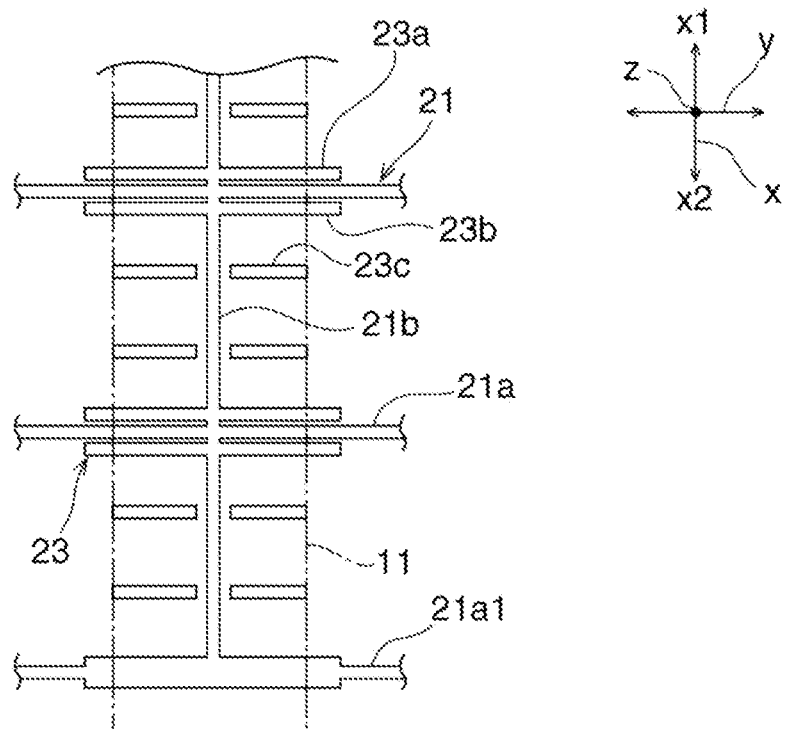
FIG. 17 is a schematic plan view of a portion of the light-receiving surface electrode in the fifth embodiment in an end portion of the light-receiving surface in the x direction.
Figure 18:
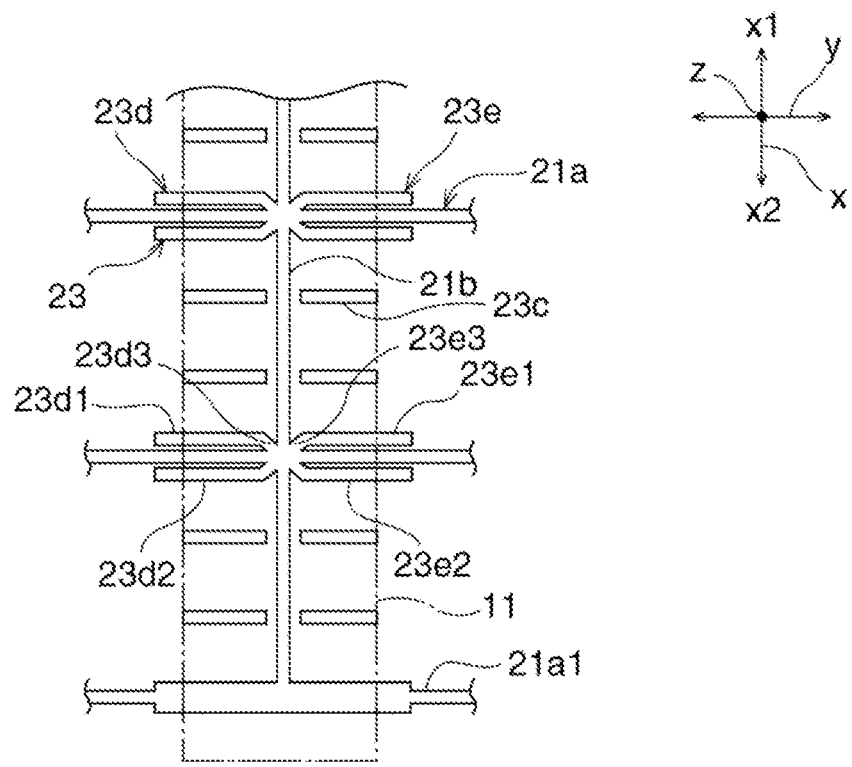
FIG. 18 is a schematic plan view of a portion of the light-receiving surface electrode in the sixth embodiment in an end portion of the light-receiving surface in the x direction.
Figure 19:
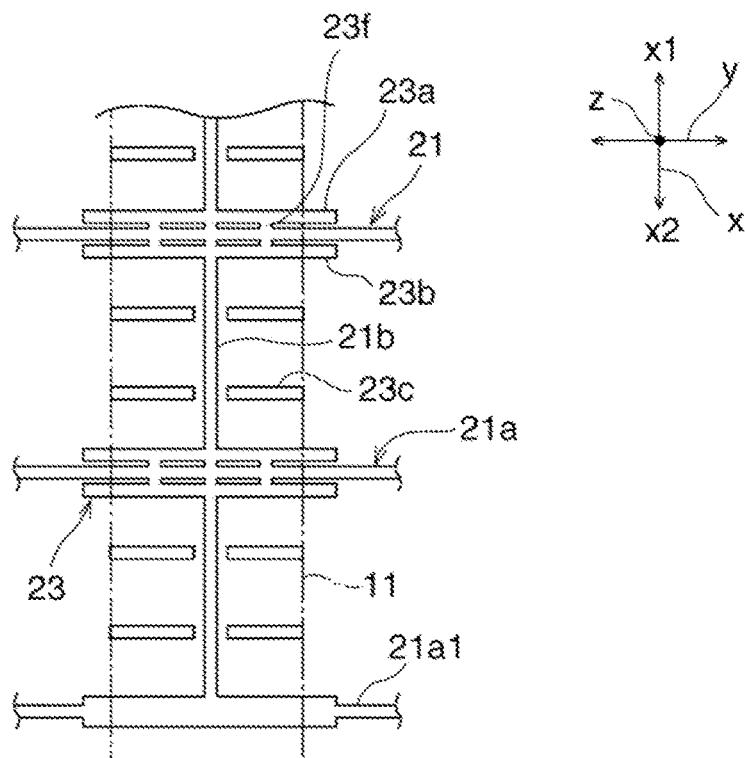
FIG. 19 is a schematic plan view of a portion of the light-receiving surface electrode in the seventh embodiment in an end portion of the light-receiving surface in the x direction.

FIG. 17 is a schematic plan view of a portion of the light-receiving surface electrode 21 in the fifth embodiment in an end portion of the light-receiving surface 20A in the x direction. FIG. 18 is a schematic plan view of a portion of the light-receiving surface electrode 21 in the sixth embodiment in an end portion of the light-receiving surface 20A in the x direction. FIG. 19 is a schematic plan view of a portion of the light-receiving surface electrode 21 in the seventh embodiment in an end portion of the light-receiving surface 20A in the x direction.

In the fifth through seventh embodiments, the protruding portions 23c are provided so as not to connect to either the busbar portion 23b or the finger portion 21a. More specifically, in these embodiments, protruding portions 23c are provided on both sides of the busbar portion 21b. This can increase the perimeter of the protruding portions 23 and improve the bonding strength of the wiring material 11.

As in the case of the first embodiment, the fifth through seventh embodiments are able to effectively suppress delamination of the wiring material 11.

8th Embodiment

Figure 20:
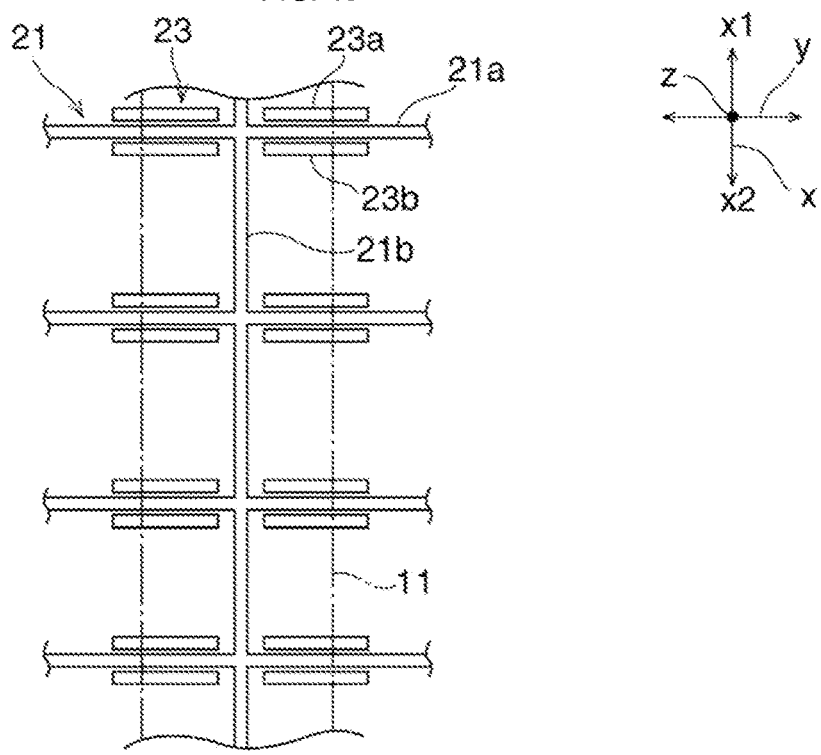
FIG. 20 is a schematic plan view of a portion of the light-receiving surface electrode in the eighth embodiment in the central portion of the light-receiving surface in the x direction.
Figure 21:
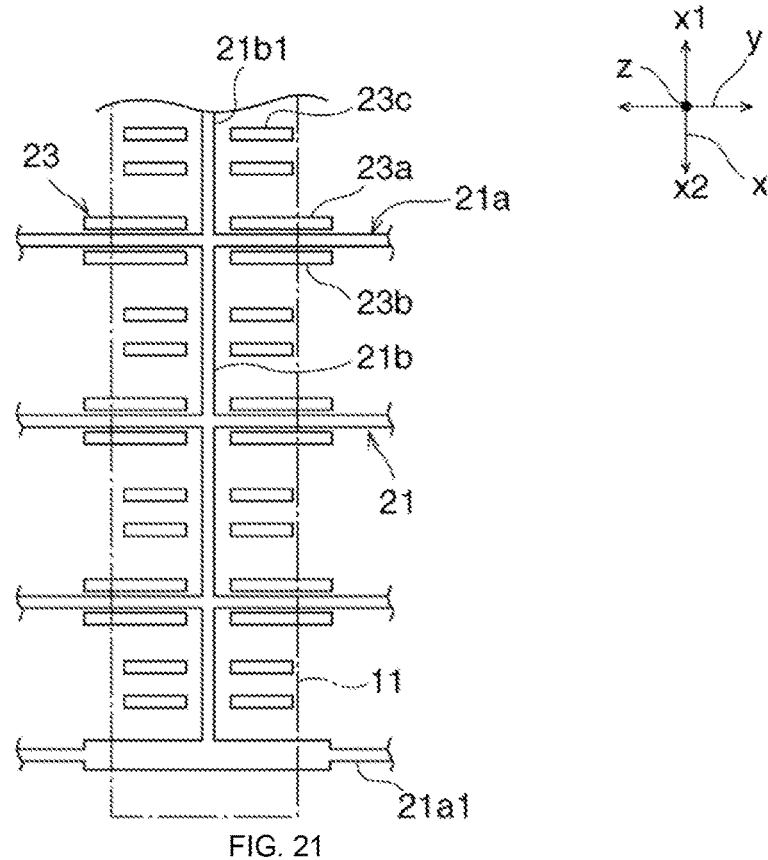
FIG. 21 is a schematic plan view of a portion of the light-receiving surface electrode in the eighth embodiment in an end portion of the light-receiving surface in the x direction.

FIG. 20 is a schematic plan view of a portion of the light-receiving surface electrode 21 in the eighth embodiment in the central portion of the light-receiving surface 20A in the x direction. FIG. 21 is a schematic plan view of a portion of the light-receiving surface electrode 21 in the eighth embodiment in an end portion of the light-receiving surface 20A in the x direction.

The present embodiment differs from the fifth embodiment in that protruding portions 23a, 23b are provided on both sides of the busbar portion 21b but do not make contact with the busbar portion 21b. In other words, the protruding portions 23a, 23b, 23c are separated from both the busbar portion 21b and the finger portion 21a. This makes the perimeters of the protruding portions 23 longer than a case in which they intersect or make contact, and this can improve the bonding strength of the wiring material.

As in the case of the first embodiment, the eighth embodiment is able to effectively suppress delamination of the wiring material 11.

9th Embodiment

Figure 22:
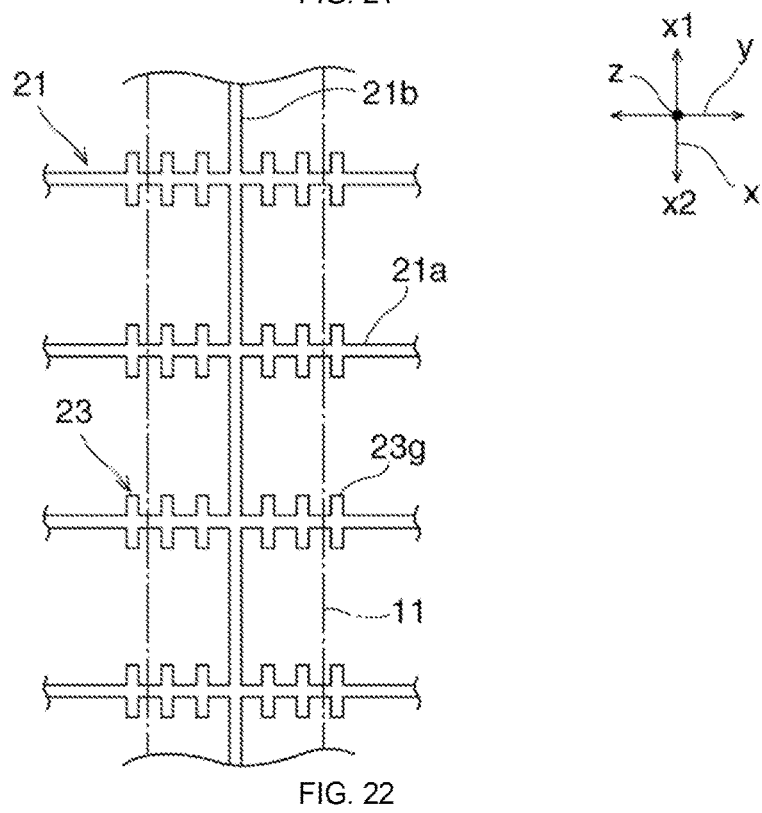
FIG. 22 is a schematic plan view of a portion of the light-receiving surface electrode in the ninth embodiment in the central portion of the light-receiving surface in the x direction.
Figure 23:
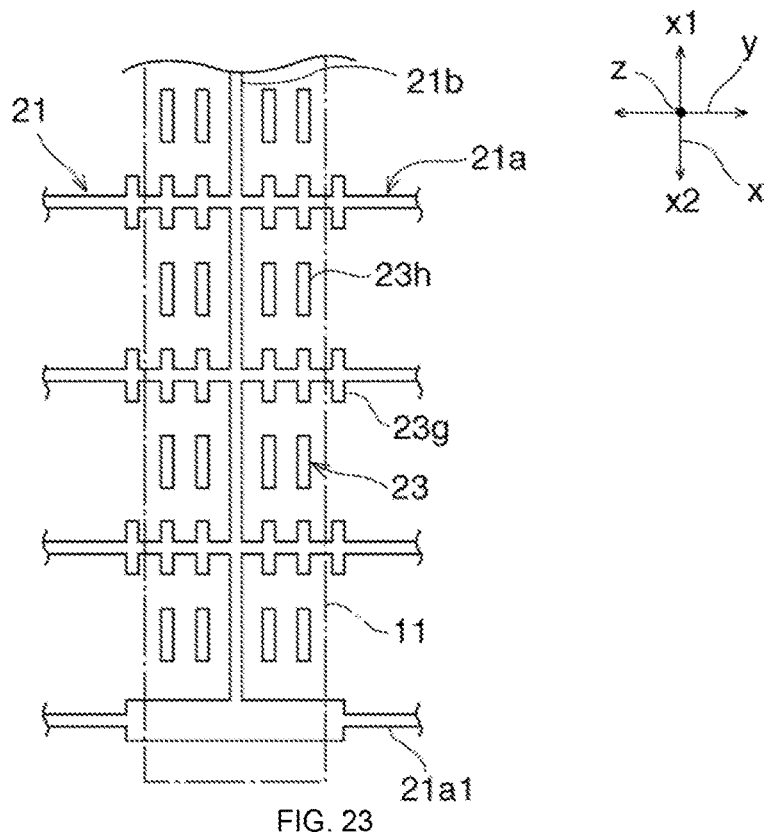
FIG. 23 is a schematic plan view of a portion of the light-receiving surface electrode in the ninth embodiment in an end portion of the light-receiving surface in the x direction.

FIG. 22 is a schematic plan view of a portion of the light-receiving surface electrode 21 in the ninth embodiment in the central portion of the light-receiving surface 20A in the x direction. FIG. 23 is a schematic plan view of a portion of the light-receiving surface electrode 21 in the ninth embodiment in an end portion of the light-receiving surface 20A in the x direction.

In the present embodiment, the protruding portions 23 include protruding portions 23g and 23h. These protruding portions 23g, 23h extend in the x direction. Protruding portions 23g are provided near the finger portion 21a. The protruding portions 23g intersect the finger portion 21a. A plurality of protruding portions 23g are arranged in the y direction, which is the direction in which the finger portion 21a extends. Protruding portions 23h are provided in the end portions and not in the central portions of the light-receiving surface 20A in the x direction. A plurality of protruding portions 23h are arrayed in the y direction. The number of protruding portions 23h arrayed in the y direction is less than the number of protruding portions 23g arrayed in the y direction. Each protruding portion 23h is provided beneath the wiring material 11 in its entirety, but some of protruding portion 23g is provided beneath the wiring material 11 while the rest is provided outside of the wiring material 11.

As in the case of the first embodiment, the ninth embodiment is able to effectively suppress delamination of the wiring material 11.

In the present embodiment, the protruding portions 23 extend in the x direction, which is also the direction in which the wiring material 11 extends. This effectively distributes the compression load on the wafer when the wiring material 11 is connected.

10th-11th Embodiments

Figure 24:
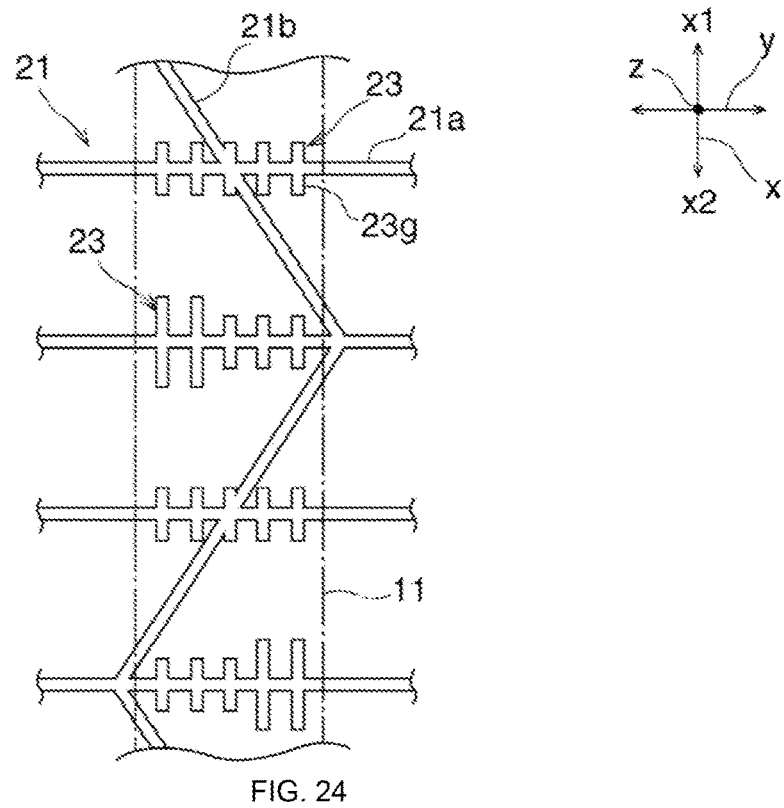
FIG. 24 is a schematic plan view of a portion of the light-receiving surface electrode in the tenth embodiment in the central portion of the light-receiving surface in the x direction.
Figure 25:
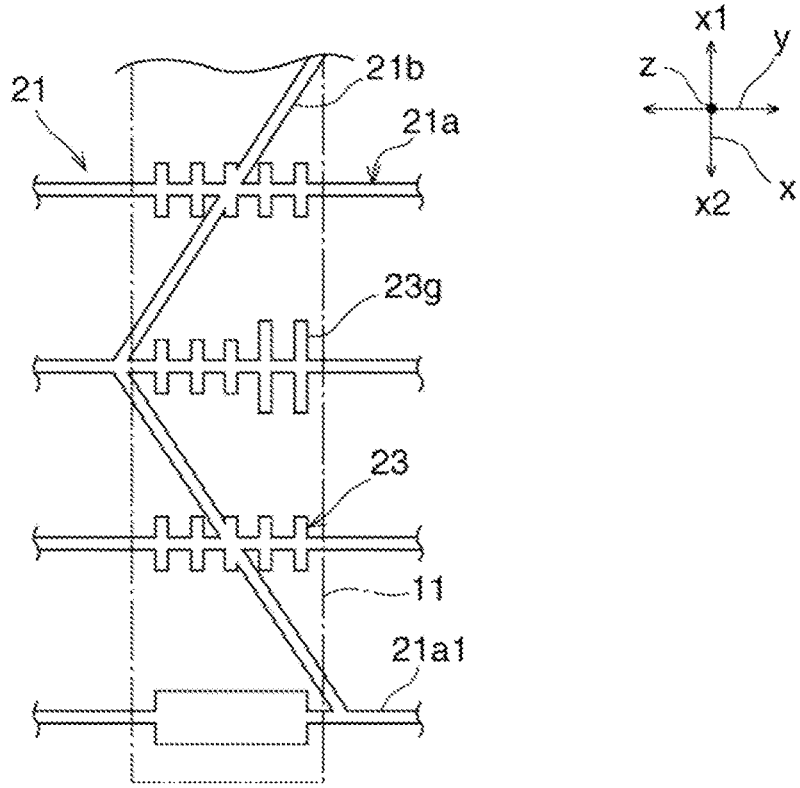
FIG. 25 is a schematic plan view of a portion of the light-receiving surface electrode in the tenth embodiment in an end portion of the light-receiving surface in the x direction.
Figure 26:
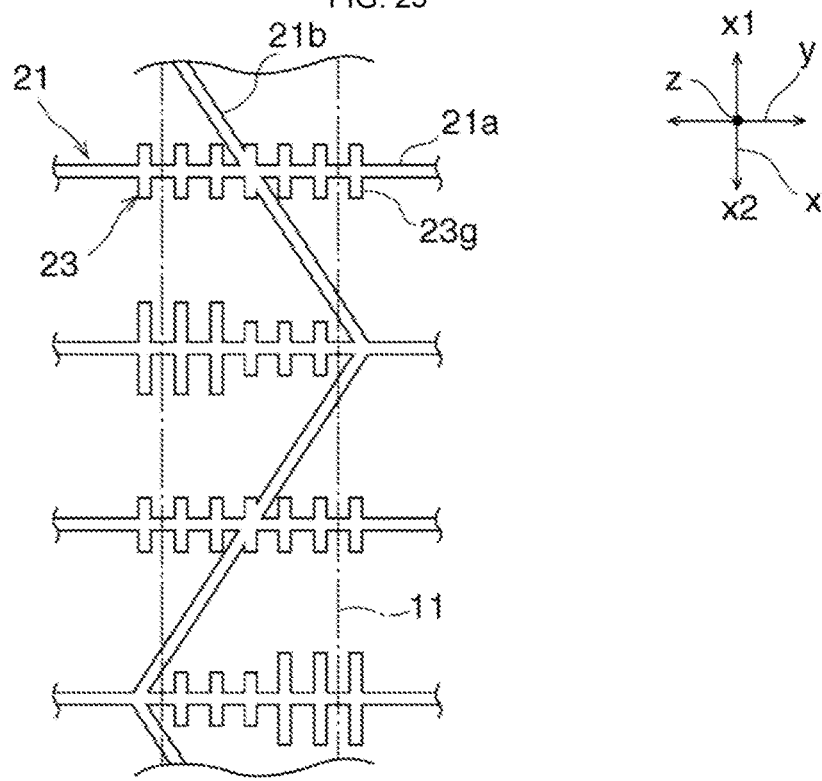
FIG. 26 is a schematic plan view of a portion of the light-receiving surface electrode in the eleventh embodiment in the central portion of the light-receiving surface in the x direction.
Figure 27:
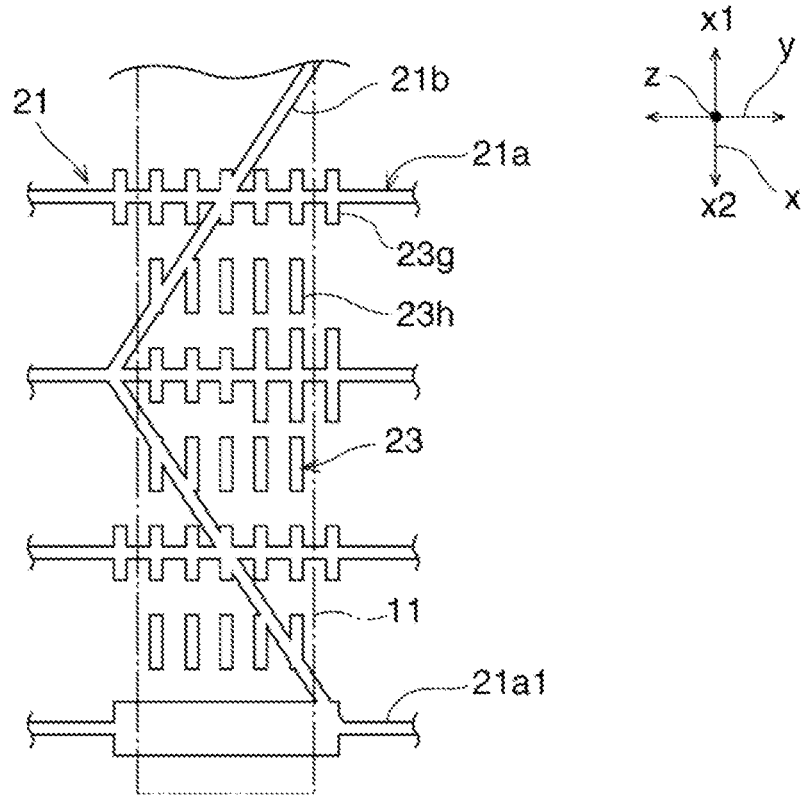
FIG. 27 is a schematic plan view of a portion of the light-receiving surface electrode in the eleventh embodiment in an end portion of the light-receiving surface in the x direction.

FIG. 24 is a schematic plan view of a portion of the light-receiving surface electrode 21 in the tenth embodiment in the central portion of the light-receiving surface 20A in the x direction. FIG. 25 is a schematic plan view of a portion of the light-receiving surface electrode 21 in the tenth embodiment in an end portion of the light-receiving surface 20A in the x direction. FIG. 26 is a schematic plan view of a portion of the light-receiving surface electrode 21 in the eleventh embodiment in the central portion of the light-receiving surface 20A in the x direction. FIG. 27 is a schematic plan view of a portion of the light-receiving surface electrode 21 in the eleventh embodiment in an end portion of the light-receiving surface 20A in the x direction.

In the explanation of the first through ninth embodiments, the busbar portion 21b is linear and extends in the x direction. However, the present invention is not limited to this configuration. As shown in the tenth and eleventh embodiments, the busbar portion 21b may be zigzag-shaped and extend in the x direction. This can suppress delamination of the wiring material 11 as effectively as the first embodiment. However, this also effectively disperses the compression load on the wafer during connection of the wiring material 11. Because it extends the perimeter of the protruding portions 23 longer, it can also improve the bonding strength of the wiring material 11.

In the tenth embodiment, as in the ninth embodiment, protruding portions 23h are provided in addition to protruding portions 23g. In the tenth embodiment, among the protruding portions 23g arrayed in the y direction, the protruding portions near the busbar portion 21b are shorter, and the protruding portions farther away from the busbar portion 21b are longer. This effectively increases the bonding strength of the wiring material 11 and the solar cell 10 even in the portion farther away from the busbar portion 21b.

In the eleventh embodiment, a busbar portion 21c is provided in addition to busbar portion 21b in an end portion of the light-receiving surface 20A in the x direction. This busbar portion 21c is not provided in the central portion of the light-receiving surface 20A in the x direction. The busbar portion 21c is linear and extends in the x direction. The addition of this busbar portion 21c can improve the adhesive strength of the wiring material 11 to the solar cells 10 in the end portion where delamination starts.

Also, in the eleventh embodiment, all of protruding portion 23g is provided beneath the wiring material 11 in the central portion of the light-receiving surface 20A in the x direction, and a portion of the protruding portion 23g is provided on both sides of the wiring material 11 in the end portion. As a result, the adhesive strength of the end portions of the wiring material 11 is not likely to decline relative to the solar cell 10 even when the wiring material 11 has been misaligned relative to the solar cell 10 in the y direction. This can reliably suppress delamination of the wiring material 11.

Both a linear busbar portion and a zigzag busbar portion may be provided over the entire light-receiving surface 20A.

KEY TO THE DRAWINGS

1: Solar cell module
10: Solar cell
11: Wiring material
12: Resin adhesive layer
20: Photoelectric conversion unit
20A: Light-receiving surface
20B: Back surface
20a: Semiconductor substrate
20c: n-type amorphous semiconductor layer
20f: p-type amorphous semiconductor layer
21: Light-receiving surface electrode
22: Back surface electrode
21a, 22a: Finger portions
21b, 22b: Busbar portions
23: Protruding portion

What is claimed is:

1. A solar cell comprising:
a photoelectric conversion unit having a first main surface and a second main surface,
a first electrode provided on the first main surface, wherein a wiring material for electrically connecting the solar cell to another solar cell is to be connected to the first electrode, and
a second electrode provided on the second main surface;
the first electrode having:
finger portions extending in a first direction and arrayed in a second direction perpendicular to the first direction leaving gaps between the finger portions in the second direction;
a busbar portion extending linearly in the second direction and intersecting with and connected electrically to the finger portions; and
protruding portions provided on the first main surface on at least one side of the busbar portion in the first direction such that the protruding portions extend in the first direction and are substantially perpendicular to the busbar portion, wherein lengths of the protruding portions extending from the busbar portion in the first direction are shorter than lengths of the finger portions from the busbar portion in the first direction, and the protruding portions and the busbar portion are provided in an area overlapping with the wiring material in a direction normal to the first main surface, wherein
ends of the protruding portions provided nearer the busbar portion in the first direction are directly in contact with the busbar portion or the finger portions, and ends of the protruding portions provided away from the busbar portion in the first direction are spaced away from any finger portions and the busbar portion, the protruding portions are provided so that a total of perimeters of the protruding portions per unit area, beneath the wiring material, in an end portion of the first main surface in the second direction is longer than a total of perimeters of the protruding portions per unit area, beneath the wiring material, in a central portion of the first main surface in the second direction; and wherein the protruding portions extend to the outside of the wiring material such that a part of each of the protruding portions is exposed from the wiring material.

2. The solar cell according to claim 1, wherein the protruding portions are provided so that the total of perimeters of the protruding portions per unit area, beneath the wiring material, in the end portion is greater by at least a factor of 1.1 than the total of perimeters of the protruding portions per unit area, beneath the wiring material, in the central portion.

3. The solar cell according to claim 1, wherein the protruding portions are provided so that the number of protruding portions per unit area, beneath the wiring material, in the end portion is greater than the number of protruding portions, beneath the wiring material, in the central portion.

4. The solar cell according to claim 1, wherein the protruding portions includes a first protruding portion provided near a first finger portion in the second direction.

5. The solar cell according to claim 4, wherein the first protruding portion is provided so that a distance between the first protruding portion and the first finger portion in the second direction is at least one-third an interval of the gaps between the finger portions in the second direction.

6. The solar cell according to claim 4, wherein the first protruding portion is arranged so that a distance between the first protruding portion and the first finger portion in the second direction is 0.7 mm or less.

7. The solar cell according to claim 4, wherein the first protruding portion is arranged so that a distance between the first protruding portion and the first finger portion in the second direction is 10 times the width of the finger portion or less.

8. The solar cell according to claim 1, wherein the protruding portions in addition to extending in the first direction also include linear portions extending in the second direction.

9. The solar cell according to claim 1, wherein the protruding portions includes a protruding portion intersecting one of the finger portions.

10. The solar cell according to claim 1, wherein the protruding portions are formed of a conductive member.

11. The solar cell according to claim 10, wherein the protruding portions are made of a material identical to the wiring material of the first electrode.

12. The solar cell according to claim 1, wherein a height of the protruding portions is equal to a height of the finger portions.

13. The solar cell according to claim 1, wherein the width of the protruding portions ranges from 0.5 to 2 times a width of the finger portions.

14. The solar cell according to claim 4, wherein the protruding portions includes a second protruding portion arranged between adjacent two of the finger portions in the second direction.

15. The solar cell according to claim 14, wherein the second protruding portion is provided in the end portion of the first main surface in the second direction.

16. The solar cell according to claim 14, wherein the second protruding portion is provided in the central portion of the first main surface in the second direction.

17. The solar cell according to claim 1, wherein the first main surface is a light-receiving surface.

18. A solar cell module comprising: a plurality of solar cells, each including a photoelectric conversion unit having a first main surface and a second main surface, a first electrode provided on the first main surface, and a second electrode provided on the second main surface; the solar cell module comprising a wiring material for electrically connecting a first electrode and a second electrode of adjacent solar cells, and an adhesive layer made of a resin for bonding the solar cell and the wiring material;

the first electrode of each of the plurality of solar cells having:
finger portions extending in a first direction and arrayed in a second direction perpendicular to the first direction leaving gaps between the finger portions in the second direction; and a busbar portion extending linearly in the second direction and intersecting with and connected electrically to the finger portions, the solar cell also having:

protruding portions provided on the first main surface on at least one side of the busbar portion in the first direction such that the protruding portions extend in the first direction and are substantially perpendicular to the busbar portion, wherein lengths of the protruding portions extending from the busbar portion in the first direction are shorter than lengths of the finger portions from the busbar portion in the first direction, and the protruding portions, and the busbar portion are provided in an area overlapping with the wiring material in a direction normal to the first main surface, wherein ends of the protruding portions provided nearer the busbar portion in the first direction are directly in contact with the busbar portion or the finger portions, and ends of the protruding portions provided away from the busbar portion in the first direction are spaced away from any finger portions and the busbar portion;

the protruding portions are provided so that the total of perimeters of the protruding portions per unit area, beneath the wiring material, in an end portion of the first main surface in the second direction is longer than the total of perimeters of the protruding portions per unit area, beneath the wiring material, in a central portion of the first main surface in the second direction; and wherein the protruding portions extend to the outside of the wiring material such that a part of each of the protruding portions is exposed from the wiring material.

19. The solar cell module according to claim 18, wherein the protruding portions have a first protruding portion provided near the finger portion in the second direction;

a portion of the resin adhesive layer spanning a side wall of the first protruding portion and the wiring material is continuous with a portion of the resin adhesive layer spanning a side wall of the finger portion and the wiring material.

20. The solar cell module according to claim 18, wherein the protruding portions has a second protruding portion provided between adjacent two of the finger portions in the second direction.

21. The solar cell module according to claim 20, wherein the second protruding portion is provided in the end portion of the first main surface in the second direction.

22. The solar cell module according to claim 21, wherein the second protruding portion is provided in a region in which an end portion of the wiring material of the first main surface is positioned.

23. The solar cell module according to claim 18, wherein the resin adhesive layer includes a resin layer and conductive particles dispersed in the resin layer.

* * * * *